United States Patent [19]

Nishizawa et al.

[11] Patent Number: 5,065,206

[45] Date of Patent: Nov. 12, 1991

[54] PHOTOELECTRIC CONVERTING DEVICE WITH ACCUMULATING GATE REGION

[75] Inventors: Jun-Ichi Nishizawa; Takashige Tamamushi, both of Sendai; Hideo Maeda, Tokyo, all of Japan

[73] Assignees: Nikon Corporation, Tokyo; Zaidan Hojin Handotai Kenkyu Shinkokai, Sendai, both of Japan

[21] Appl. No.: 301,334

[22] Filed: Jan. 25, 1989

[30] Foreign Application Priority Data

Jan. 29, 1988 [JP] Japan .................. 63-17295

[51] Int. Cl.$^5$ .......................... H01L 27/14
[52] U.S. Cl. ........................ 357/30; 357/32; 357/58; 357/22
[58] Field of Search ............ 357/23.4, 30 R, 22 R, 357/22 B, 22 C, 22 E, 43, 30 I, 23.9, 30 H, 32, 30 G, 30 P, 58

[56] References Cited

U.S. PATENT DOCUMENTS

| | | | |
|---|---|---|---|
| 3,836,993 | 9/1974 | Joshi | 357/27 |
| 4,249,190 | 2/1981 | Cho | 357/22 |
| 4,504,847 | 3/1985 | Nishizawa | 357/22 |
| 4,651,180 | 3/1987 | Nishizawa et al. | 357/22 |
| 4,733,286 | 3/1988 | Matsumoto | 357/23.1 |
| 4,952,996 | 8/1990 | Nishizawa et al. | 357/30 |

FOREIGN PATENT DOCUMENTS 62-9678 1/1987 Japan .

Primary Examiner—William Mintel
Assistant Examiner—Roy Potter
Attorney, Agent, or Firm—Shapiro and Shapiro

[57] ABSTRACT

A semiconductor device comprises a semiconductive substrate of a low impurity concentration, a channel area of a low impurity concentration formed on the substrate, a source area formed on the channel area and having a high impurity concentration of a conductive type opposite to that of the substrate, a drain area formed on the channel area and having a high impurity concentration of a conductive type opposite to that of the substrate, and an accumulating gate area formed on the channel area and having a conductive type same as that of the substrate. The source area and drain area are arranged in a predetermined direction along the substrate. The accumulating gate area comprises a first part sandwiched between the source area and the drain area and extended in a direction crossing the predetermined direction and second and third parts connected with the first part and approximately extended in the predetermined direction. The accumulating gate area is adapted to accumulate a charge corresponding to the intensity of the incident radiation. A current flows from one to the other of the source area and the drain area through a part of the channel area sandwiched between the first part of the accumulating gate area and the substrate. The potential of the accumulating gate area varies according to the accumulated charge. The current varies according to the potential of the accumulating gate area.

11 Claims, 7 Drawing Sheets

PHOTOELECTRIC CONVERTING DEVICE WITH ACCUMULATING GATE REGION

BACKGROUND OF THE INVENTION

1. Field of the Invention

The present invention relates to a photoelectric converting device of the gate accumulation type composed of electrostatic induction transistors or punching through bipolar transistors, and more particularly to a photoelectric converting device composed of surface-gate lateral-junction electrostatic induction transistors or punching-through bipolar transistors. Such a device is adapted for use as a solid-state image sensor.

2. Related Background Art

A known solid-state image sensor consisting of an X-Y matrix arrangement of photoelectric converting devices composed of static induction transistors (SIT) in so-called vertical structure is shown in FIGS. 2A and 2B, which are respectively a schematic plan view and a schematic cross-sectional view along a line 2B—2B in FIG. 2A.

An n+ substrate 21 constitutes a drain area (region) on which an n− channel area (region) 22 is formed. In the surface layer thereof are formed an n+ source area (region) 23 and a surrounding p+ accumulating gate area (region) 24.

The p+ accumulating gate area 24 serves to accumulate the charge accumulated by photoelectric conversion. On the gate area 24, there is formed a gate capacitor 25. Under the application of a gate readout pulse $\phi_G$, the potential of n− channel 22 is lowered according to the amount of accumulated charge, and a drain current is amplified and generated according to the $I_{DS}$-$V_{GS}$ characteristics of SIT.

A pixel separating area 26 is composed for example of a dielectric material or diffusion of a p+ material.

FIGS. 2A and 2B correspond to a pixel of a solid-state image sensor utilizing SIT as the pixel, and the gate capacitor $C_G$ 25 and the separating area 26 can be dispensed with if the photoelectric converting device is composed of a SIT.

SUMMARY OF THE INVENTION

The conventional photoelectric converting device (SIT) has been associated with following drawbacks:

(1) The position of a pinch-off point (where the potential is largest in the direction of depth and smallest in a direction parallel to the surface in the n−-channel 22, as represented by G* in FIG. 2B) in the potential barrier controlling the drain current, and the potential $\phi_G^*$ thereof depend on the distance $l_g$ of p+ gate, diffusion depth $Xj^p$ of the p+ accumulating gate area 24, concentration and depth of n− channel etc. Particularly the p+-gate distance $l_g$ is determined by the lateral diffusion of the p+-accumulating gate and, this is easily influenced by fluctuations in the diffusion process, so that the position of the pinch-off point G* and its potential $\phi_G^*$ are easily affected. For this reason the characteristics of SIT show fluctuations and are not stable;

(2) The diffusion depth $Xj^p$ of the p+-accumulating gate area 24 cannot be simply made shallower, since it determines the characteristics of the SIT. Consequently the accumulating gate area 24 causes light absorption, thus reducing the sensitivity for blue light;

(3) As the diffusion depth $Xj^p$ of the accumulating gate area 24 cannot be made smaller, it is difficult to make the SIT pixel smaller, so that a solid state image sensor with a large number of pixels cannot be obtained.

The object of the present invention is to provide a photoelectric converting device which is not associated with such drawbacks, has the position of the pinch-off point G* and its potential $\phi_G$ not easily influenced by fluctuations in the diffusion process, and has a high blue sensitivity and can be easily made compact.

The foregoing object can be achieved according to the present invention by a photoelectric converting device which comprises:

a semiconductive substrate of a low impurity concentration;

a channel area of a low impurity concentration formed on said substrate;

a source area formed on said channel area and having a high impurity concentration of a conductive type opposite to that of the substrate;

a drain area formed on said channel area and having a high impurity concentration of a conductive type opposite to that of the channel area; and an accumulating gate area formed on said channel area and having a conductive type the same as that of the substrate;

wherein said source area and drain area are arranged in a predetermined direction along the substrate; said accumulating gate area comprises a first part sandwiched between the source area and the drain area and extended in a direction crossing said predetermined direction and a second part connected with said first part and approximately extended in said predetermined direction; said accumulating gate area is adapted to accumulate a charge corresponding to the intensity of the incident radiation; a current flows from one to the other of the source area and the drain area through the channel area sandwiched between the first part of the accumulating gate area and the substrate; the potential of the accumulating gate area varies according to the accumulated charge; and the current varies according to the potential of the accumulating gate area.

DESCRIPTION OF THE PREFERRED EMBODIMENTS

The photoelectric converting device (static induction transistor (SIT) or punching-through bipolar transistor) of the present invention is a surface-gate lateral-junction SIT with an accumulating surface gate, or a punching-through bipolar transistor, in which a charge obtained by photoelectric conversion is accumulated in the accumulating gate area, and in which a source or drain current flows in a channel area, positioned under a narrowed portion of the gate, substantially parallel to the plane of the substrate. Said current is controlled by the potential of a pinch-off point G*, formed in the channel area between the narrowed portion of the accumulating gate and the substrate.

A device structure in which the channel area is of a low impurity concentration of a conductive type opposite to that of the substrate is called SIT, while a device structure in which the channel area is of a low impurity concentration of a conductive type the same as that of the substrate is called a punching-through bipolar transistor.

The punching-through bipolar transistor, in which the potential of the channel is controlled by the gate voltage through the capacitative coupling, shows a similar behavior as the SIT. In the following description, therefore, the term SIT will be used collectively to denote both SIT and punching-through bipolar transistor devices.

Figure 2A:
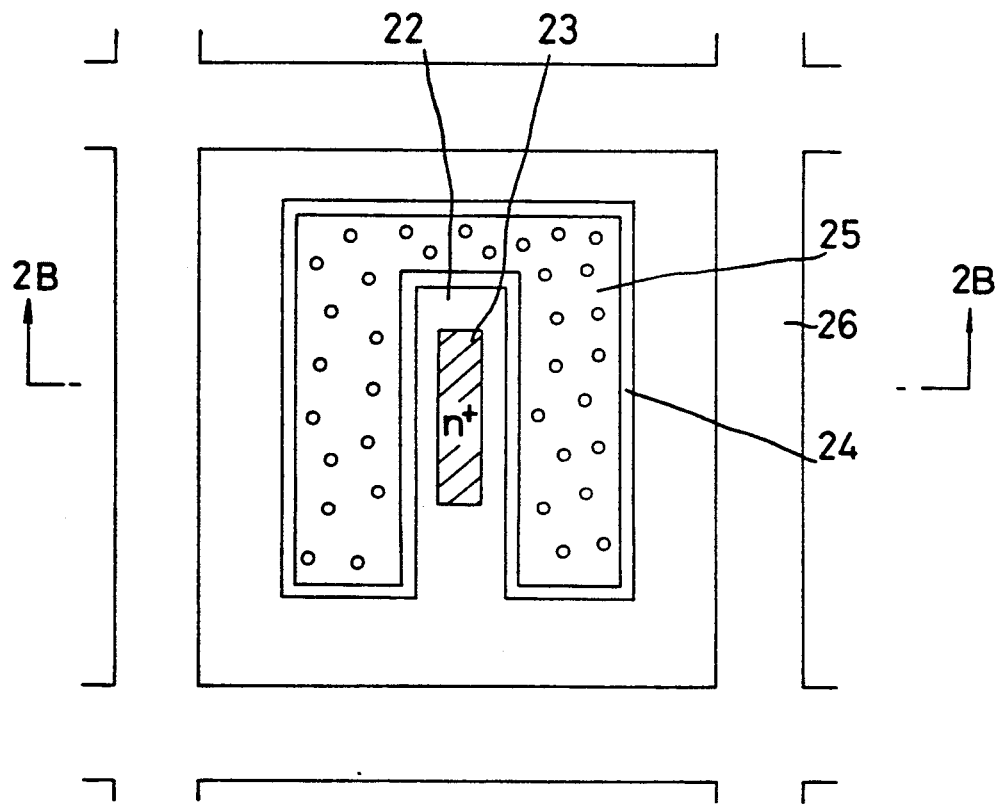
FIG. 2A is a schematic plan view of a conventional photoelectric converting device employed in a solid-state image sensor.
Figure 2B:
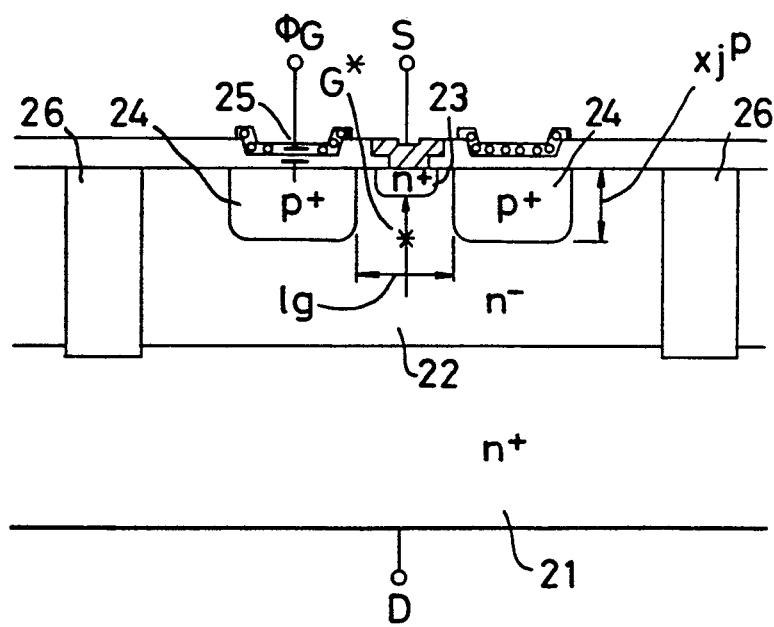
FIG. 2B is a schematic cross-sectional view thereof along a line 2B—2B of FIG. 2A.

The gate distance $l_g$ in the conventional structure shown in FIG. 2B corresponds, in the SIT of the present invention, to the distance, in the direction of depth, between the substrate and the gate diffusion area. In the following description, this will be called the channel width $l_g$.

In the present invention, the channel width $l_g$ is easily controlled, as it is determined by the vertical diffusion with less fluctuation in comparison with the conventional lateral diffusion. Also the length of narrower gate portion, constituting a part of the gate area, is reproducibly determined by the dimension of a photomask.

It is therefore rendered possible to avoid the drawback in the conventional vertical SIT wherein the position of the pinch-off point G* and its potential are easily influenced by the fluctuations in the diffusion process.

(1st embodiment)

Figure 1A:
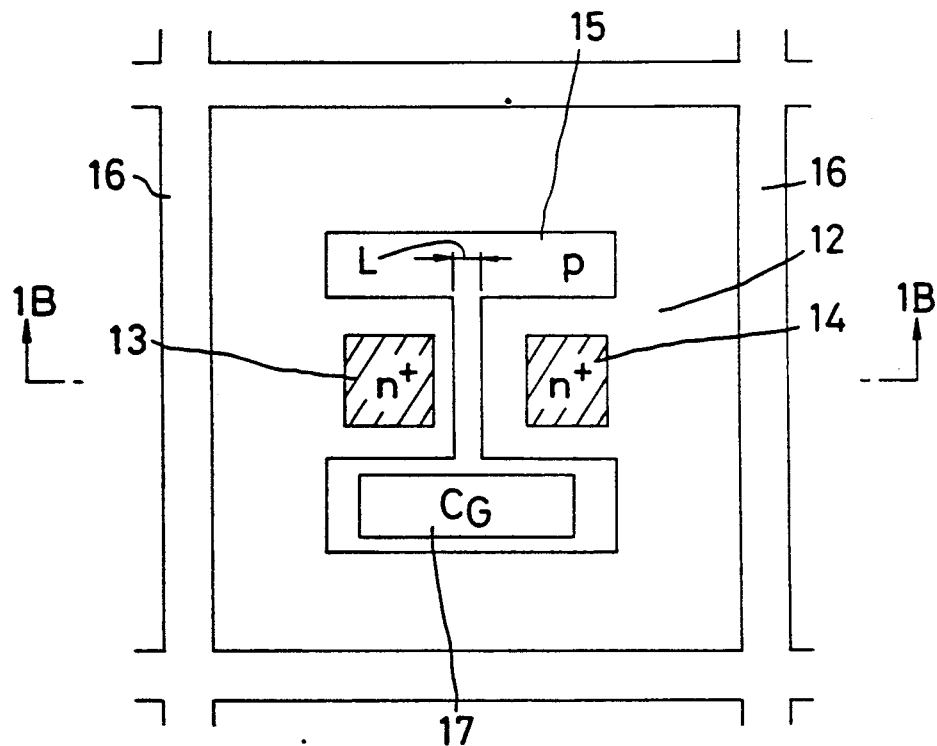
FIG. 1A is a schematic plan view of a photoelectric converting device, constituting a first embodiment of the present invention, employed in a solid-state image sensor.
Figure 1B:
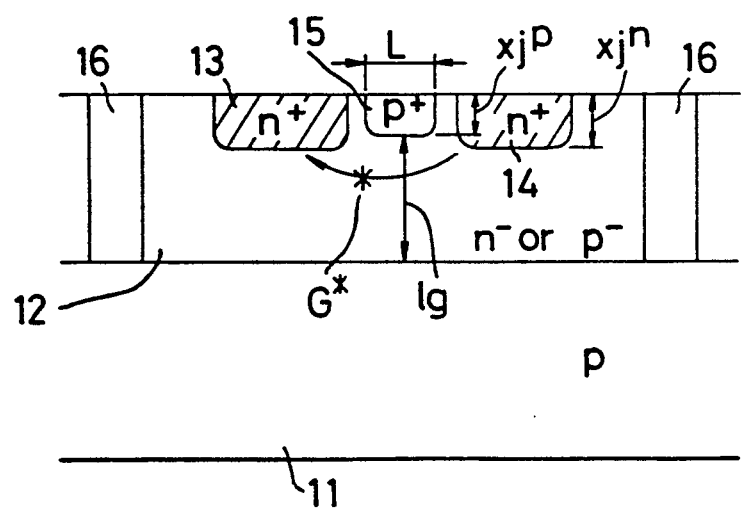
FIG. 1B is a schematic cross-sectional view along a line 1B—1B of FIG. 1A.

FIG. 1A is a schematic plan view of a photoelectric converting device of the present embodiment, applied to a solid-state image sensor, and FIG. 1B is a schematic cross-sectional view along a line 1B—1B.

In the surface layer of a channel area 12 formed on a p-substrate 11, there are formed an n+-source area 13, an n+-drain area 14, and a p+-accumulating gate area 15 positioned therebetween.

A gate capacitor $C_G$ 17 is provided by forming an electrode on a part of the accumulating gate area 15, across an oxide film.

The accumulating gate area 15 is formed in part as an area of narrow gate length L between the source area 13 and the drain area 14, in order to prevent a source or drain current $I_{DS}$ along the surface layer of the channel area 12.

Said accumulating gate area 15 is formed overall as an H-shape embracing the source area 13 and the drain area 14, in order to avoid a source or drain current, going around said narrow portion of the gate area.

A separating area 16, for separating the pixels when the photoelectric converting devices of the present invention are employed as pixels in a solid-state image sensor, is composed of a dielectric material or a pn junction.

Between the n+-source area 13 and the n+-drain area 14, the p+-accumulating gate area 15 serves to define the width of the n−-channel as $l_g$.

The source or drain current flows, substantially parallel to the plane of the substrate as indicated by an arrow, in a gap between the narrow gate portion L of the p+-accumulating gate area 15 and the p-substrate 11.

The position of the pinch-off point G* and its potential $\phi_G^*$ are determined by various parameters such as the width $l_g$ of the n−- or p−-accumulating channel, length L of the p+-accumulating gate etc.

The thickness of the n+- or p+-channel area 12 is usually determined by the epitaxial growth, while the diffusion depth $Xj^p$ of the p+-accumulating gate area 15 is determined by the vertical diffusion, both with sufficient precision. Also the gate length L of the accumulating gate area 15 is mostly determined by the dimension of the photomask, as the diffusion depth $Xj^p$ of the p+-accumulating gate area 15 is sufficiently small. Consequently the position of the pinch-off point G* and its potential $\phi_G^*$ are not easily influenced by fluctuations in the process, so that the devices can be obtained in mass production without fluctuations in the characteristics.

Also the photoelectric converting device (SIT) can be made smaller, as the thickness of the channel area 12, the junction depth $Xj^n$ of the source area 13 and the drain area 14, and the junction depth $Xj^p$ of the accumulating gate area 15 are small.

Figure 1C:
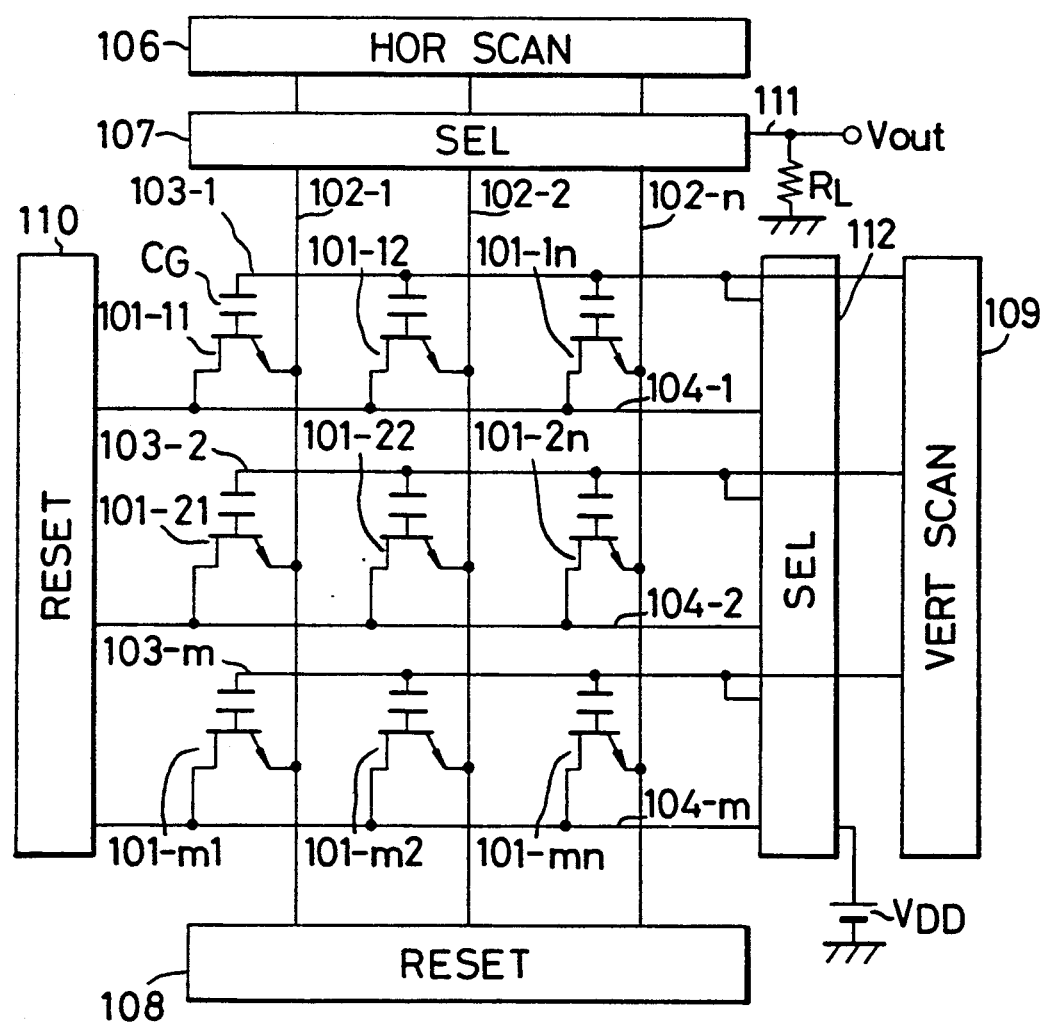
FIG. 1C is a schematic circuit diagram of an entire solid-state image sensor.

FIG. 1C shows an example of the circuit of the entire solid-state image sensor, wherein 101-11 to 101-mn indicate SIT pixels. The sources of the SIT pixels are connected to column lines 102-1 to 102-n which are connected, through a reading selection circuit 107, to a video line 111. Said reading selection circuit 107 performs a scanning operation by a horizontal scanning circuit 106. On the other ends of the column lines there is connected a column line resetting circuit 108. For the purpose of simplicity, FIG. 1C only shows nine SIT pixels, the remainder being omitted.

The drains of the SIT pixels 101 are connected to first row lines 104-1 to 104-m, which are connected, through a row selecting circuit 112, to a voltage supply terminal $V_{DD}$. On the other ends of the first row lines there is connected a row line resetting circuit 110. Second row lines 103-1 to 103-m, connected to the row line selecting circuit 112 and the gates of the SIT pixels are scanned by a vertical scanning circuit 109.

FIG. 1C shows only an example of the two-dimensional matrix arrangement of the SIT's of the present invention. It is also possible, for example, to inversely connect the sources and drains of the SIT's. It is also possible to utilize the column resetting circuit 108 and the row resetting circuit 110 as the setting circuits for the columns and rows, by applying the voltage $V_{DD}$ through a load resistor $R_L$ to the video line 111 and to ground the first row lines through the row selecting circuit. There may also be adopted a one-dimensional arrangement. (Embodiment 1-2: variation of the 1st embodiment)

Figure 3A:
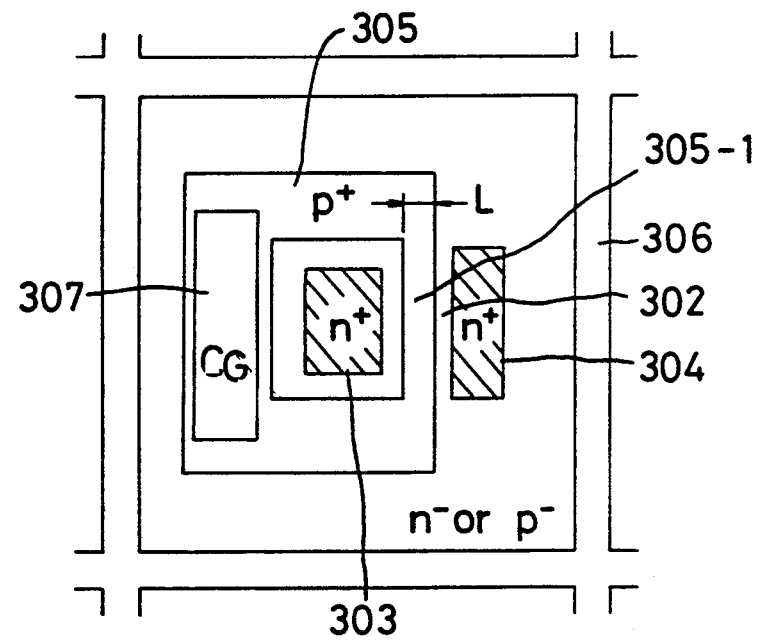
FIGS. 3A and 3B are schematic plan views of a photoelectric converting device constituting variations of the first embodiment.
Figure 3B:
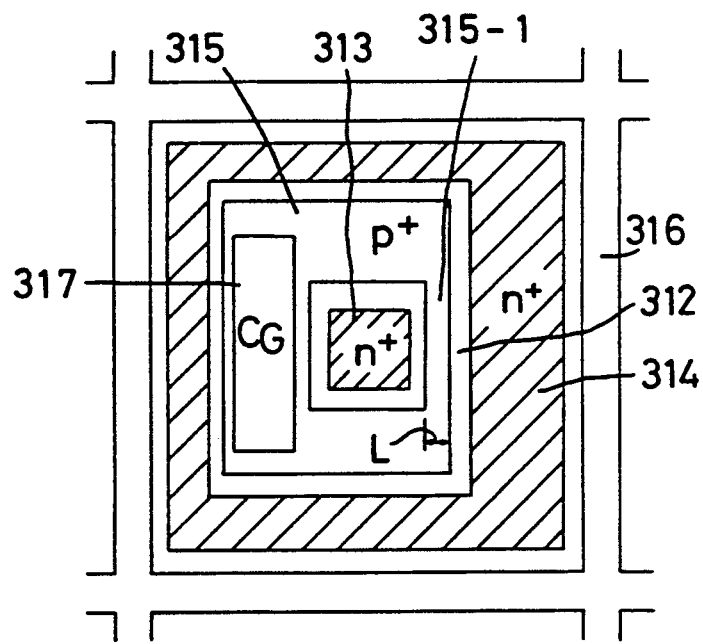

The plan structure of the SIT is not limited to that shown in FIG. 1A but may assume structures such as shown in FIGS. 3A and 3B, which have cross-sections similar to that shown in FIG. 1B (and therefore not shown separately in the drawings).

In FIG. 3A, the p+-accumulating gate area 305 is so formed as to completely surround the n+-source area 303, so that no drain current is generated in the surface layer.

An n+-drain area 304 is positioned opposite to the n+-source area 303, across a narrow gate portion 305-1 of a length L of the accumulating gate area 305.

Except in said portion 305-1, the p+-accumulating gate area 305 is formed wider, in order to prevent undesirable drain current. A gate capacitor $C_G$ 307 is provided by forming an electrode on a part of the accumulating gate area 305, across an oxide film.

The drain current flows from the drain area 304 to the n+-source area 303, through a gap between the narrow gate portion 305-1 of the length L and the p-substrate (not shown).

The present embodiment is characterized by a low leak current due to the presence of the n−- or p−-channel area 302 between the p+-accumulating gate 305 and the separating area 306, and by a large aperture rate because the channel area 302 is wide and shows a high sensitivity to light.

In FIG. 3B, a p+-accumulating gate area 315 is so formed as to surround an n+-source area 313, and an n+-drain area 314 is so formed as to surround gate area 315. A narrow portion 315-1 of the p+-accumulating gate is formed with a length L, and the drain current flows in a gap between the narrow portion 315-1 of the length L between the p+-accumulating gate and the p-substrate (not shown).

A gate capacitor $C_G$ 317, for resetting etc., is formed on the p+-accumulating gate area 315. The present embodiment can prevent dark current to the p+-accumulating gate area 315 as it is surrounded by the n+-drain area 314.

(2nd embodiment)

Figure 4A:
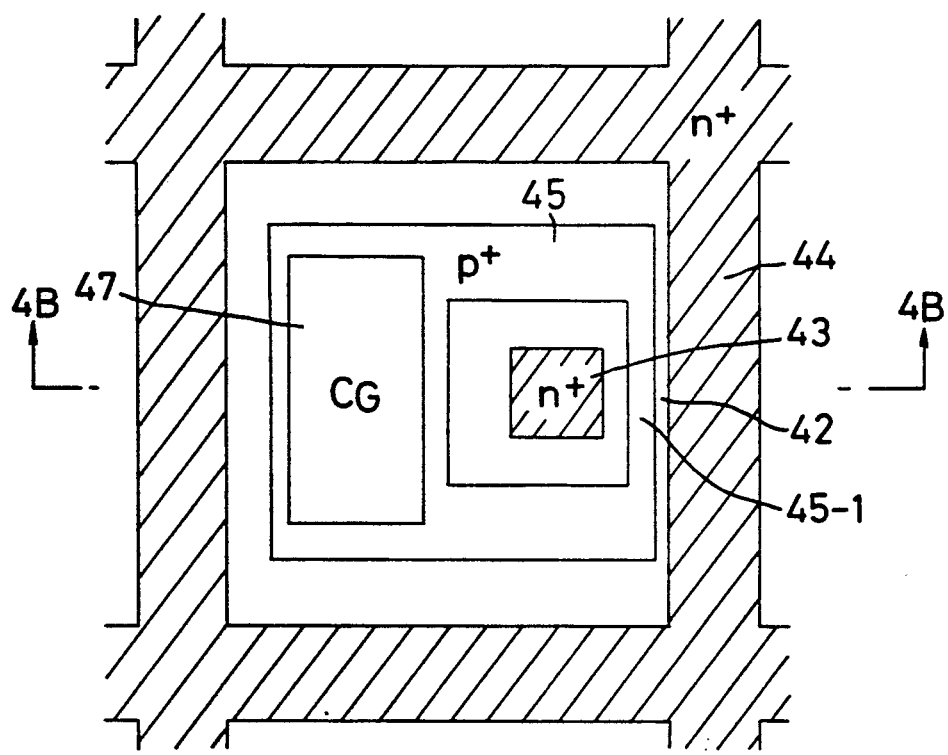
FIG. 4A is a schematic plan view of a photoelectric converting device constituting a second embodiment of the present invention, employed in a solid-state image sensor.

FIG. 4A is a schematic plan view of a photoelectric converting device (SIT) of the present embodiment, applied to a solid-state image sensor.

On the surface layer there are provided an n+-source area 43 and an n+-drain area 44 which serves as a separating area common for different SIT pixels, and a p+-accumulating gate area 45 is formed therebetween so as to surround the n+-source area 43.

The p+-accumulating gate area 45 is partly formed as a narrow portion 45-1 of a length L, and is partly provided thereon with a gate capacitor $C_G$ 47.

Figure 4B:
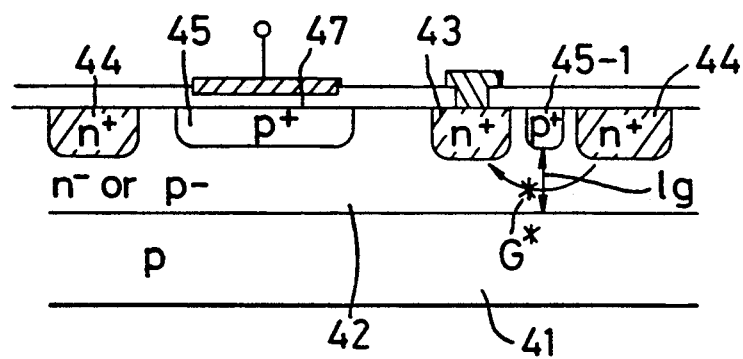
FIG. 4B is a schematic cross-sectional view thereof along line 4B—4B of FIG. 4A.

FIG. 4B is a cross-sectional view along a line 4B—4B in FIG. 4A. The drain current flows, as indicated by an arrow, from the n+-drain area 44 to the n+-source area 43 through an n−-channel of a width $l_g$ between the narrow portion 45-1 of the p+-accumulating gate and the p-substrate 41.

Figure 4C:
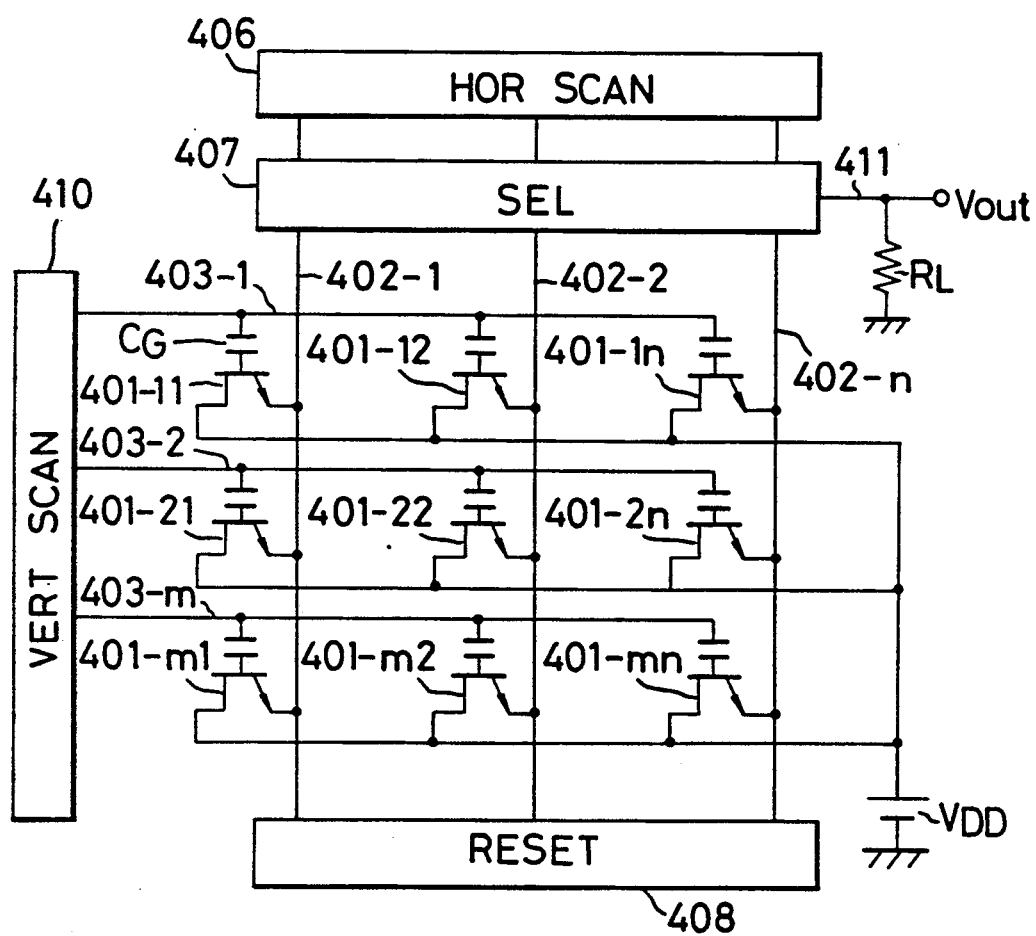
FIG. 4C is a schematic circuit diagram of said solid-state image sensor.

FIG. 4C is a circuit diagram showing an example of the circuit of a solid-state image sensor composed of a two-dimensional matrix arrangement of the SIT pixels.

In FIG. 4C, the sources of the SIT pixels 401-11 to 401-mn are connected to column lines 402-1 to 402-n, which are commonly connected to a video line 411 through a readout selecting circuit 407. The video line 411 is grounded through a load resistor, and is also connected to a video output terminal Vout.

The readout selecting circuit 407 is selected in succession by a horizontal scanning circuit 406. The other ends of the column lines are connected to a resetting circuit 408.

The drains of the SIT pixels are commonly connected to a voltage terminal $V_{DD}$, and the gates of the SIT pixels are connected, through row lines 403-1 to 403-m, to a vertical scanning circuit.

In the present embodiment, the n+-source 43 is formed as independent for each SIT pixel, but it is also possible to arrange the source and drain in an inverse manner. In such case, in FIG. 4C, the sources of the SIT pixels are commonly grounded, while the drains thereof are connected to the column lines. As in FIG. 1C, FIG. 4C only shows nine SIT pixels for the purpose of simplicity, other pixels being omitted.

The arrangement of the SIT pixels is not limited to two-dimensional as shown in FIG. 4C but can be one-dimensional. The 2nd embodiment enables a smaller construction of the pixel, as a separate pixel separating area can be dispensed with, because the n+-drain 44 in FIG. 4A serves also as the pixel separating area.

(3rd embodiment)

Figure 5:
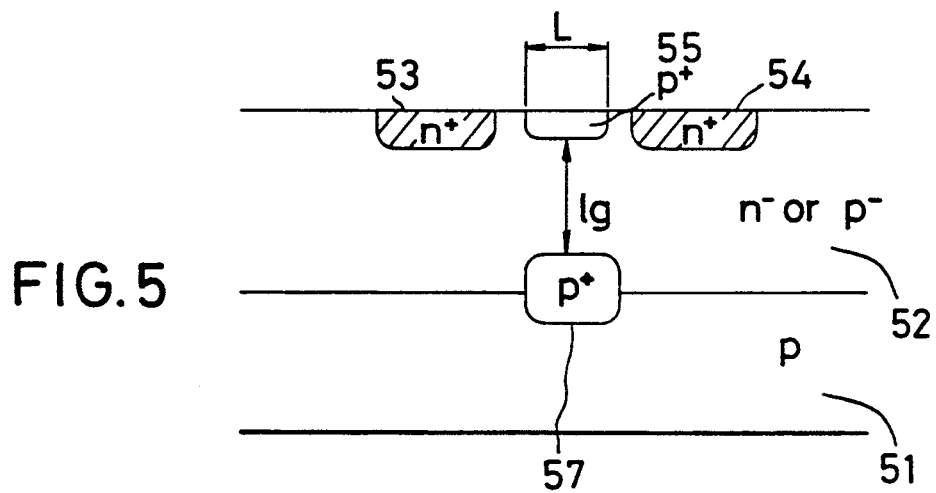
FIG. 5 is a schematic cross-sectional view of a photoelectric converting device constituting a third embodiment of the present invention.

FIG. 5 shows the cross section of a photo electric converting device of the present embodiment. This embodiment is characterized in a structure similar to that of the 1st embodiment (see FIG. 1B), by the presence of a p+-embedded area 57 between an n−- or p−-channel area 52 and the p-substrate 51, in a position below the p+-accumulating gate area 55.

As the width $l_g$ of the channel is thus defined by the upper p+-accumulating gate area 55 and the p -embedded area 57, the position of the pinch-off point G* in the channel area 52 and its potential $\phi_G^*$ may be determined with good control. Also the thicknesses of the channel area 52 outside the portion between the areas 55 and 57 can be selected independently, so that the SIT can have a high spectral sensitivity at the longer wavelength side.

The structure will not be explained further, as it is same as in the 1st embodiment except for the p+-embedded area 57. FIG. 5 does not show the separating area as there is shown a photoelectric converting device consisting solely of an SIT.

The plan structure of the 3rd embodiment may be that shown in FIG. 1A, 3A, 3B or 4A, or a modification thereof. (4th embodiment)

Figure 6A:
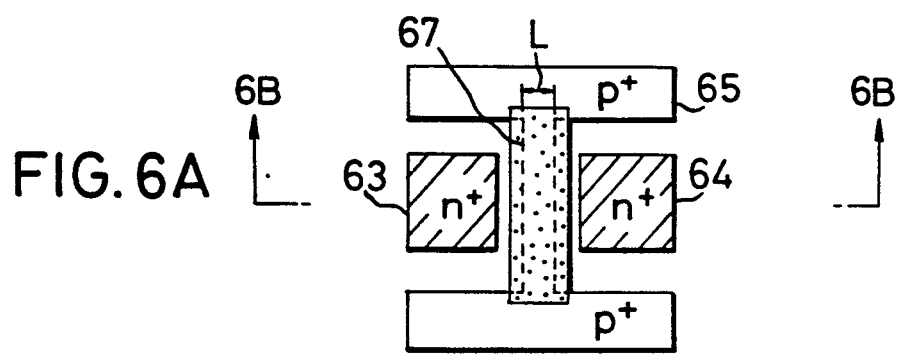
FIG. 6A is a schematic plan view of a photoelectric converting device constituting a fourth embodiment of the present invention, employed in a solid-state image sensor.

FIG. 6A is a schematic plan view of a photoelectric converting device of the present embodiment.

This is substantially same as that of the 1st embodiment, except that the gate capacitor $C_G$ 67, formed on a part of the p+-accumulating gate area 65, is formed particularly on the narrow portion of length L.

Figure 6B:
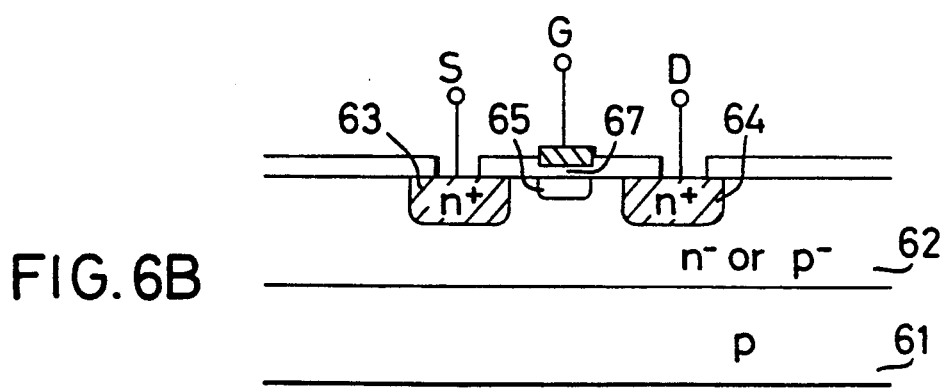
FIG. 6B is a schematic cross-sectional view thereof along line 6B—6B of FIG. 6A.

FIG. 6B is a schematic cross-sectional view along a line 6B—6B in FIG. 6A. On a p-substrate 61 there is formed an n−-channel 62, and, on the surface layer thereof, there are formed an n+-source area 63, an n+-drain area 64, a narrow portion of a length L of a p+-accumulating gate 65, and a gate capacitor $C_G$ 67 having an electrode portioned of the narrow gate portion across an oxide film.

The present embodiment is not limited to the structure shown in FIGS. 6A and 6B but also may be achieved by forming the gate capacitor $C_G$ on the narrow portion of the length L of the p+-accumulating gate in a plan structure as shown in FIG. 3A, 3B or 4A, and the cross-sectional structure ay include a p+-embedded area 57 as shown in FIG. 5.

Due to the presence of the gate capacitor $C_G$ on the narrow portion of length L of the p+-accumulating gate 65, the present 4th embodiment enables the formation of the source area 63, drain area 64 and gate capacitor $C_G$ 67 by a self-alignment process, thereby simplifying the process or facilitating shallow junction formation of the source area 63 and the drain area 64.

The present invention is not limited to the foregoing embodiment, but is subject to various modifications. In the foregoing description n-SIT type devices have been explained, but p-SIT devices can naturally be formed in a similar manner. Also in the foregoing embodiments, the photoelectric converting device (SIT) has a rectangular plan form as shown in FIGS. 1A, 3A, 3B and 4A, but it may also have a different polygonal shape, a circular shape or any other shape.

Also, the impurity concentration of the accumulating gate area, which is assumed to be a high p+ concentration in the foregoing embodiments, can be a low p− concentration or a medium p concentration. It need not be uniform throughout the area, and the accumulating gate may include an area of different concentration. For example a part or all of the narrow portion of length L may have a low p− concentration, while the remainder has a high + concentration. However, in case of a punching-through bipolar transistor, the impurity concentration of the accumulating gate area is selected higher than that in the channel area.

The present invention is naturally applicable as a photoelectric converting device having one or plural SIT's (pixels). In such case it is possible to obtain the output signal by photoelectrically converted charge in the accumulating gate area of the SIT pixel and applying a readout pulse through the gate capacitor $C_G$, or by DC output of the drain current in the floating state of the accumulating gate area without the use of the gate capacitor $C_G$, or by giving a gate bias voltage, through a resistor, to an electrode formed on the accumulating gate area thereby obtaining an amplified drain current corresponding to the photoelectric charge according to said gate bias condition.

Each of the structures of the foregoing embodiments may be employed as the SIT pixel. In case of the photoelectric converting device with a single SIT, the separating area and the gate capacitor $C_G$ may be dispensed with.

The present invention provides the following advantages, in the case of employing a p-substrate, for example:

(1) The channel width $l_g$ of the n−- or p−-channel area is determined by the diffusion depth $Xj^p$ of the p+-accumulating gate area and the thickness of the n−- or p−-channel area (or diffusion width of p+ embedded area), and is less influenced by the fluctuations in the diffusion process. Consequently the position of the pinch-off point G* in the channel area and its potential $\phi_G*$ less subject to such fluctuations. Thus the photoelectric converting devices show uniform properties without fluctuations.

(2) The device can be easily made compact, as the diffusion depth $Xj^p$ of the p+-accumulating gate area can be made smaller.

(3) Also, the n+-source area and the drain area can be made shallower, and the gate capacitor can be formed on a part of the p+-accumulating gate area. In this manner it is possible to suppress light absorption in the n+-source/drain areas, p+-accumulating gate area and gate capacitor $C_G$, so that there can be obtained a device with satisfactory blue sensitivity and a high aperture rate.

(4) Also, there can be obtained a spectral sensitivity with infrared cutoff, as the n−- or p−-channel area can be made thinner.

In the present invention, the p-substrate constitutes a back gate. It is therefore possible to activate a PNP parasite transistor (p+-accumulating gate area—n−-channel—p-substrate) as an overflow drain for saturating illumination, according to the method of potential application to said p-substrate.

The manufacturing process of the SIT of the present invention is similar to the MOS process used in the peripheral scanning circuits and in the readout selecting circuits, so that the process can be used in common.

The structure of the 1st embodiment has a high light sensitivity and can receive very weak light.

The structure of the 2nd embodiment allows greater compactness, as the n+-drain area serves as the separating area and the manufacturing process is simplified.

The structure of the 3rd embodiment can have a high sensitivity at longer wavelengths, as the thickness of the n−- or p−-channel area on the p-substrate can be determined independently from the channel width $l_g$ determined by the p+-embedded layer.

What is claimed is:

1. A photosensitive semiconductor device comprising:
  (a) a semiconductor substrate of a low impurity concentration;
  (b) a channel region formed on said substrate and having a low impurity concentration;
  (c) a source region formed on said channel region and having a high impurity concentration of a conductive type opposite to that of said substrate;
  (d) a drain region formed on said channel region nd having a high impurity concentration of a conducive type opposite to that of said substrate, said source region and said drain region being spaced from one another in a predetermined direction along said substrate; and
  (e) an accumulating gate region formed on said channel region and being of the same conductive type as said substrate, said accumulating gate region having a first part which is interposed between said source region and aid drain region in planes substantially parallel to said substrate and which is at least coextensive with one of said source region and said drain region in a direction substantially perpendicular to said predetermined direction, said accumulating gate region further having second and third parts respectively connected to opposite ends of said first part and extending, in said planes, along opposite sides of said one of said source region and said drain region;

wherein said accumulating gate region is adapted to accumulate a charge corresponding to an intensity of radiation incident on said device, a current flows from one to the other of said source region and said drain region through a part of said channel region sandwiched between said first part of said accumulating gate region and said substrate, the potential of said accumulating gate region is variable according to said accumulated charge, and said current is variable according to the potential of said accumulating gate region.

2. A photo-sensitive semiconductor device according to claim 1, wherein said accumulating gate region is formed so as to completely surround said one of said source region and said drain region in said planes.

3. A photo-sensitive semiconductor device according to claim 2, wherein the other of said source region and said drain region is formed so as to completely surround said accumulating gate region in said planes.

4. A photo-sensitive semiconductor device according to claim 1, wherein the extent of said first part of said accumulating gate region in said predetermined direction is less than that of said second part of said accumulating gate region and that of said third part of said accumulating gate region in a direction substantially perpendicular to said predetermined direction.

5. A photo-sensitive semiconductor device according to claim 1, wherein the extent of said first part of said accumulating gate region in said predetermined direction is less than that of said second part of said accumulating gate region and that of said third part of said accumulating gate region in said predetermined direction.

6. A photo-sensitive semiconductor device according to claim 1, wherein said second and third parts of said accumulating gate region respectively extend along opposite sides of each of said source region and said drain region in said planes.

7. A photo-sensitive semiconductor device according to claim 1, including an insulating layer laminated on part of said accumulating gate region, and an electrode formed on said insulating layer, thus providing a gate capacitor.

8. A photo-sensitive semiconductor device according to claim 1, including an embedded region having a high impurity concentration of the same conductive type as said substrate, said embedded region being sandwiched between said channel region and said substrate beneath said first part of said accumulating gate region.

9. A photo-sensitive semiconductor device comprising:

(a) a semiconductor substrate of low impurity concentration; and (b) a plurality of pixels formed on said substrate, each pixel including a channel region having a low impurity concentration, a first high concentration region having a high impurity concentration of a conductive type opposite to that of said substrate, a second high concentration region having a high impurity concentration of a conductive type opposite to that of said accumulating gate region surrounding said first high concentration region in planes substantially parallel to said substrate and being surrounded by said second high concentration region in said panes;

wherein a current flows in each pixel from one to the other of said first and second high concentration regions through a part of said channel region sandwiched between said accumulating gate region and said substrate, said accumulating gate region is adapted to accumulate a charge corresponding to an intensity of radiation incident on said device, and said current is variable according to said accumulated charge.

10. A photo-sensitive semiconductor device comprising:

(a) a semiconductor substrate of a low impurity concentration;

(b) a channel region formed on said substrate and having a low impurity concentration;

(c) a source region formed on said channel region and having a high impurity concentration of a conductive type opposite to that of said substrate;

(d) a drain region formed on said channel region and having a high impurity concentration of a conductive type opposite to that of said substrate, and source region and said drain region being spaced from one another in a predetermined direction along said substrate;

(e) an accumulating gate region formed on said channel region and being of the same conductive type as said substrate, said accumulating gate region having a first part which is interposed between said source region and said drain region in planes substantially parallel to said substrate and which is at least coextensive with one of said source region and said drain region in a direction substantially perpendicular to said predetermined direction, said accumulating gate region further having second and third parts respectively connected to opposite ends of said first part and extending, in said planes, along opposite sides of said one of said source region and said drain region;

(f) an insulating layer laminated on said first part of said accumulating gate region; and (g) an electrode member formed on said insulating layer above first part of said accumulating gate region;

wherein a current flows from one to the other of said source region and said drain region through a part of said channel region sandwiched between said first part of said accumulating gate region and said substrate, said accumulating gate region and said part of said channel region adjacent to said first part of said accumulating gate region are adapted to accumulate a charge corresponding to an intensity of radiation incident on said device, and said current is variable according to said accumulated charge and a voltage applied to said electrode member.

11. A photo-sensitive semiconductor device according to claim 10, wherein said insulating layer is also laminated on a part of said channel region adjacent to said first part of said accumulating gate region.

* * * * *